United States Patent
Ma et al.

(10) Patent No.: US 9,523,920 B2
(45) Date of Patent: Dec. 20, 2016

(54) EXPOSURE DEVICE AND EXPOSURE METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haitao Ma, Beijing (CN); Haisheng Zhao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 274 days.

(21) Appl. No.: 14/386,245

(22) PCT Filed: Dec. 9, 2013

(86) PCT No.: PCT/CN2013/088901
§ 371 (c)(1),
(2) Date: Sep. 18, 2014

(87) PCT Pub. No.: WO2015/000263
PCT Pub. Date: Jan. 8, 2015

(65) Prior Publication Data
US 2016/0238940 A1 Aug. 18, 2016

(30) Foreign Application Priority Data
Jul. 4, 2013 (CN) .......................... 2013 1 0278663

(51) Int. Cl.
*G03B 27/62* (2006.01)
*G03B 27/42* (2006.01)
*G03F 7/20* (2006.01)

(52) U.S. Cl.
CPC ......... *G03F 7/2045* (2013.01); *G03F 7/70691* (2013.01); *G03F 7/70716* (2013.01)

(58) Field of Classification Search
CPC ..... G03F 7/20; G03F 7/70691; G03F 7/70716
(Continued)

(56) References Cited

U.S. PATENT DOCUMENTS 6,556,279 B1 * 4/2003 Meisburger ......... G03F 7/70041
250/492.2
6,634,290 B1 * 10/2003 Shimizu ............... H05K 3/1216
101/114

FOREIGN PATENT DOCUMENTS

CN 1437713 A 8/2003
CN 101271825 A 9/2008
(Continued)

OTHER PUBLICATIONS

Written Opinion of the International Searching Authority dated Apr. 3, 2014; PCT/CN2013/088901.
(Continued)

*Primary Examiner* — Hung Henry Nguyen
(74) *Attorney, Agent, or Firm* — Ladas & Parry LLP

(57) ABSTRACT

An exposure device and an exposure method are provided. The exposure device includes an exposure lamp, a mask plate and a marking equipment. The marking equipment includes a guide rail frame disposed on the mask plate, and at least one marking vehicle disposed on the guide rail frame, a controller. The controller acts to make the guide rail frame move to a corresponding exposure location on the mask plate earlier than the exposure lamp under its control, and to make the marking vehicle lie in a corresponding marking location by dint of its control, for displaying a corresponding marking identification.

20 Claims, 2 Drawing Sheets

(58) Field of Classification Search
USPC .............................. 355/53, 72–76; 101/129
See application file for complete search history.

(56) References Cited

FOREIGN PATENT DOCUMENTS

| | | | |
|---|---|---|---|
| CN | 103091974 A | 5/2013 |
| CN | 103324037 A | 9/2013 |

OTHER PUBLICATIONS

International Search Report Appln. No. PCT/CN2013/088901; Dated Apr. 16, 2014.
First Chinese Office Action Appln. No. 201310278663.5; Dated Aug. 28, 2014.

* cited by examiner

EXPOSURE DEVICE AND EXPOSURE METHOD

TECHNICAL FIELD

Embodiments of the present invention relate to an exposure device and an exposure method.

BACKGROUND

In the manufacturing process of an array substrate, it is necessary that marking be conducted on the manufactured product, i.e., an identification of the product such as ID information and a 2D code be produced on a substrate, so that computerized automation is implemented in subsequent engineering and the product state can be traced back.

When products of small size (7 inch or less) are produced, hundreds of products can usually be produced on one substrate in a 5-generation line. In general, after exposure of a first-layer circuit pattern of each product on a substrate is completed, the marking equipment is employed to perform exposure of an identifying pattern on every product on the substrate one by one, and next, development, etching, stripping and other process are conducted, so as to form the first-layer circuit pattern and the identification pattern by manufacture. Thus, marking of products is realized.

During the exposure, exposure of the circuit pattern and exposure of the identification pattern are carried out separately, and exposure of the identification pattern is conducted in such a way that exposure of the identification pattern is conducted on every product on the substrate one by one. This may lead to a too long time with the exposure process, and the production capacity is seriously affected.

SUMMARY

According to an embodiment of the present invention, there is provided an exposure device, comprising: an exposure lamp, a mask plate and a marking equipment, the marking equipment comprising:

a guide rail frame, disposed on the mask plate;

at least one marking vehicle, disposed on the guide rail frame;

a controller, configured to control the guide rail frame move to a corresponding exposure location on the mask plate earlier than the exposure lamp, and to control the marking vehicle lie in a corresponding marking location, for displaying a corresponding marking identification.

In one example, the marking vehicle is a mask for forming an identification pattern.

In one example, the marking vehicle includes a body module and a display panel module assembled together;

the display panel module includes: an identification display zone and a transmissive buffer zone that is located between the body module and the identification display zone;

the identification display zone acts to display the corresponding marking identification when the marking vehicle lies in the corresponding marking location;

the transmissive buffer zone acts to conduct a transmissive display.

In one example, after exposure of a marking location at a first exposure location on the mask plate with the exposure lamp is finished, the controller acts to control the identification display zone of the marking vehicle to perform a transmissive display, and meanwhile to control the guide rail frame start to move, so that the guide rail frame moves to a second exposure location on the mask plate earlier than the exposure lamp.

In one example, a moving speed of the exposure lamp upon the mask plate being exposed with it is in a range of 0.2 to 0.3 m/s, and a moving speed of the guide rail frame under the control of the controller is in a range of 3.0 to 6.0 m/s.

In one example, both the guide rail frame and the marking vehicle are provided with infrared detectors, which are used to detect locations of the marking vehicle and the guide rail frame on the mask plate.

In one example, the controller acts to receive location of the guide rail frame on the mask plate detected by the infrared detectors by a wireless transmission technology, to control the guide rail frame move to the corresponding exposure location on the mask plate, next, to receive location of the marking vehicle on the mask plate detected by the infrared detectors by the wireless transmission technology, and further to send a control signal to the marking vehicle by the wireless transmission technology to control the marking vehicle move to the corresponding marking location, so as to display the corresponding marking identification.

In one example, the device further comprises a linear motor;

the linear motor is connected to the guide rail frame, and acts to drive the guide rail frame to move linearly along a direction perpendicular to the guide rail frame on the mask plate;

the controller acts to take control of movement of the guide rail frame by controlling the linear motor.

In one example, the exposure machine is configured to conduct a row-by-row exposure on the mask plate, the direction in which the guide rail moves is perpendicular to a row direction, and the guide rail is configured to be able to control the marking vehicle move in the row direction.

In one example, in a propagating direction of lights emitted by the exposure lamp, the exposure lamp, the marking vehicle and the mask plate are arranged sequentially in this order.

In one example, a portion of the mask plate corresponding to a place in need of marking is pervious to light.

Another embodiment of the invention provides an exposure method with the exposure device claimed as claim 1, comprising the following steps:

moving the exposure lamp horizontally to conduct an exposure on the mask plate;

making the guide rail frame move to a corresponding exposure location on the mask plate earlier than the exposure lamp under the control of the controller, and making the marking vehicle lie in a corresponding marking location under the control of the controller, so as to display a corresponding marking identification.

In one example, the marking vehicle includes a body module and a display panel module assembled together; the display panel module includes: an identification display zone and a transmissive buffer zone that is located between the body module and the identification display zone; wherein, the identification display zone acts to display the corresponding marking identification when the marking vehicle lies in the corresponding marking location; the transmissive buffer zone acts to conduct a transmissive display;

making the guide rail frame move to the corresponding exposure location on the mask plate earlier than the exposure lamp under the control of the controller and making the marking vehicle lie in the corresponding marking location under the control of the controller so as to display the corresponding marking identification includes:

after exposure of the identification display zone at a first exposure location on the mask plate with the exposure lamp is finished, making the identification display zone of the marking vehicle perform a transmissive display under the control of the controller, and meanwhile making the guide rail frame start to move under the control of the controller, so that the guide rail frame moves to a second exposure location on the mask plate earlier than the exposure lamp.

In one example, a moving speed of the exposure lamp upon the mask plate being exposed with it is in a range of 0.2 to 0.3 m/s, and a moving speed of the guide rail frame under the control of the controller is in a range of 3.0 to 6.0 m/s.

In one example, both the guide rail frame and the marking vehicle are provided with infrared detectors, which are used to detect locations of the marking vehicle and the guide rail frame on the mask plate; and making the marking vehicle lie in a corresponding marking location under the control of the controller so as to display the corresponding marking identification includes:

receiving location of the guide rail frame on the mask plate detected by the infrared detectors through a wireless transmission technology by the controller, making the guide rail frame move to the corresponding exposure location on the mask plate under the control of the controller, afterwards, receiving location of the marking vehicle on the mask plate detected by the infrared detectors through the wireless transmission technology by the controller, and then sending a control signal to the marking vehicle by the wireless transmission technology from the controller to make the marking vehicle lie in the corresponding marking location, so as to display a corresponding marking identification.

In one example, the device further comprises a linear motor; the linear motor is connected to the guide rail frame, and acts to drive the guide rail frame to move linearly along a direction perpendicular to the guide rail frame on the mask plate; and the control over the movement of the guide rail frame with the controller includes:

taking control of movement of the guide rail frame by means of controlling the linear motor with the controller.

In an exposure device and exposure method thereof provided by the above technical solutions, a controller is employed to make the guide rail frame move to a corresponding exposure location on the mask plate earlier than the exposure lamp under its control, and to make the marking vehicle lie in a corresponding marking location under its control to display a corresponding marking identification, waiting for the exposure lamp to move to the exposure location, so as to accomplish exposure of an identification pattern at the exposure location. As such, while exposure of a circuit pattern is finished with the exposure lamp, exposure is also conducted at identifying locations on the mask plate, so as to accomplish exposure of identification patterns. When it is compared to the case in an existing technology that a one-time exposure is conducted on a mask plate at first, and then identification patterns are exposed one by one, time of the exposure process is greatly saved, and production capacity is enhanced.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

Figure 1:
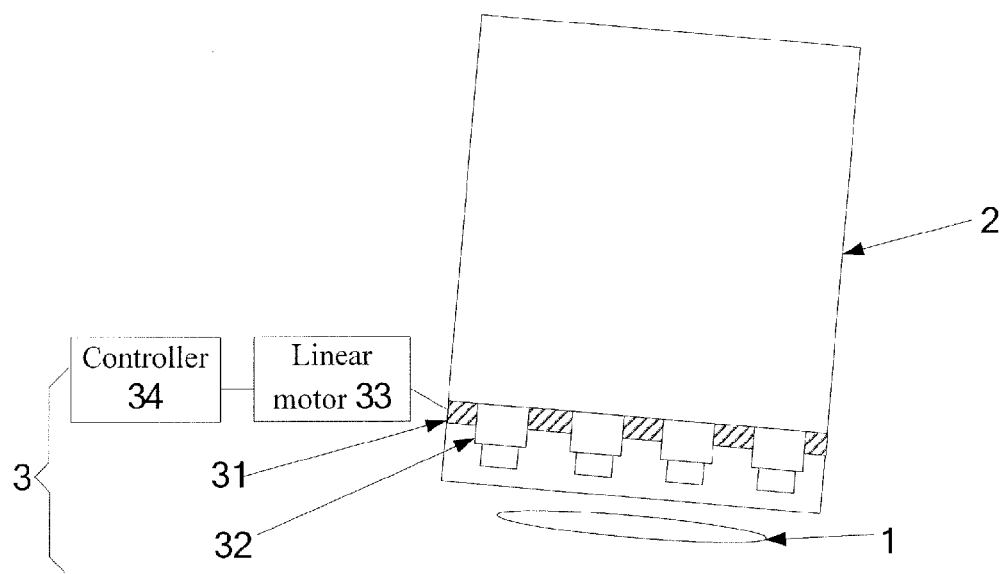
FIG. 1 is a structurally schematic view illustrating an exposure device provided by an embodiment of the invention.

According to an embodiment of the invention, there is provided an exposure device. As illustrated in FIG. 1, the exposure device comprises an exposure lamp 1, a mask plate 2 and a marking equipment 3. The marking equipment 3 includes: a guide rail frame 31, disposed on the mask plate 2; at least one marking vehicle 32, disposed on the guide rail frame 31; and a controller 34, for controlling the guide rail frame 31 to move to a corresponding exposure location on the mask plate 2 earlier than the exposure lamp 1, and for controlling the marking vehicle 32 move to a corresponding marking location, so as to display a corresponding marking identification.

It is to be noted here that, the exposure location and the marking location on the mask plate 2 are fixed, and the exposure lamp 1 is a linear light source, and carries out a horizontal movement relative to the mask plate 1, so as to conduct exposure operations row by row. The exposure location refers to a position in one row on the mask plate 1 where identification patterns need to emerge by exposure, and the marking location refers to a position in correspondence with each identification pattern that needs to emerge by exposure at the exposure location. So, preferably, the number of marking vehicles on the guide rail frame is the number of marking locations contained in one row on the mask plate.

In usual cases, marking locations at individual exposure locations are the same, and after the marking vehicle is moved to a corresponding marking location at a first exposure location, at the next exposure location, it is unnecessary for the controller to control the marking vehicle again for its movement. When marking locations at individual exposure locations on the mask plate are different, after the controller makes the guide rail frame move to the next exposure location on the mask plate earlier than the exposure lamp under its control, it also needs to make the marking vehicle move to a corresponding marking location under its control. For example, the exposure machine is configured to conduct a row-by-row exposure on the mask plate, the direction in which the guide rail moves is perpendicular to a row direction, and the guide rail is configured to be able to make the marking vehicle move in the row direction under its control.

In summary, the exposure lamp 1 moves horizontally to conduct a row-by-row exposure on the mask plate 2, and the controller 34 controls the guide rail frame 31 to move to a corresponding exposure location on the mask plate 2 earlier than the exposure lamp 1. When the exposure lamp moves to a corresponding exposure location where the guide rail frame 1 is located, exposure of an identification pattern can be completed. After exposure of the marking location at the corresponding exposure location is completed, the guide rail frame 31 will move to the next exposure location under the control of the controller 34 earlier, and waits for the exposure lamp 1 to move to the next exposure location, so as to accomplish exposure of an identification pattern at the next exposure location. As such, a one-time exposure is performed on the mask plate 2 with the exposure lamp 1, in which, while exposure of a circuit pattern is finished, exposure is also conducted at every identifying location on the mask plate, so as to accomplish exposure of an identification pattern. Here, in the event that the exposure lamp 1 is engaged in exposure beginning from a boundary of the mask plate 2, the first corresponding exposure location is the exposure location nearest to the boundary of the mask plate 2.

With the exposure device provided by embodiments of the invention, it is possible that while exposure of a circuit pattern is completed, exposure of an identification pattern is also completed. When it is compared to a multiple exposure in prior art, time of the exposure process is greatly saved, and production capacity is enhanced.

Figure 2:
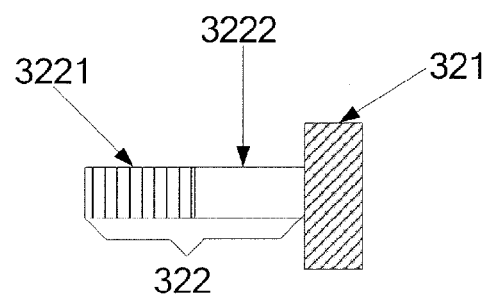
FIG. 2 is a structurally schematic view illustrating a marking vehicle provided by an embodiment of the invention.

For example, as illustrated in FIG. 2, the marking vehicle 32 includes a body module 321 and a display panel module 322 that are assembled together. The display panel module 322 includes an identification display zone 3221 and a transmissive buffer zone 3222 that is located between the body module 321 and the identification display zone 3221. The identification display zone 3221 is used to display a corresponding marking identification as the marking vehicle 32 lies in a corresponding marking location; and the transmissive buffer zone 3222 is use for transmissive display.

Figure 3:
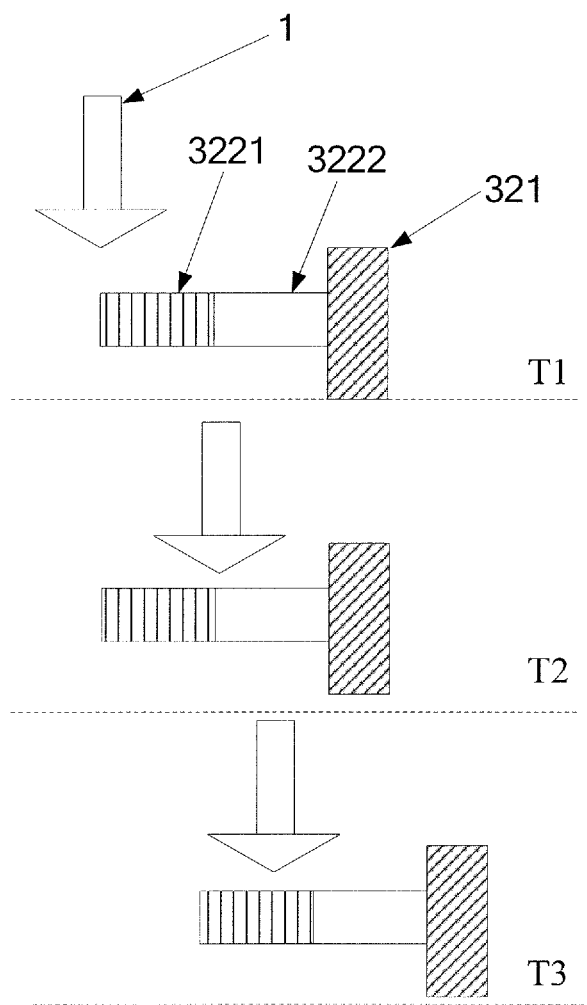
FIG. 3 is a schematic view illustrating movement of a marking vehicle during an exposure provided by an embodiment of the invention.

Because marking locations on the mask plate 2 are fixed, when the other part of the mask plate 2 is exposed with the exposure lamp 1, the guide rail frame moves to an exposure location earlier, and the marking vehicle moves to a corresponding marking location, for displaying a corresponding marking identification. As illustrated in FIG. 3, at a T1 time, the exposure lamp 1 is going to move to the exposure location. At a T2 time, the exposure lamp 1 goes through an exposure at the identification display zone 3221 of the marking vehicle at a corresponding marking location; and at this time, the exposure lamp 1 is about to enter the transmissive buffer zone 3222 that acts to avoid light of the exposure lamp from being blocked by the body module 321. When light of the exposure lamp will move out of the identification display zone 3221 at the T2 time, the identification display zone 3221 turns into transmissive display, and at the same time, the guide rail frame 31 starts to move to the next marking location, and moving speed of the guide rail frame is greater than moving speed of the exposure lamp. FIG. 3 illustrates relative positions of the exposure lamp 1 and the marking vehicle 32 at a T3 time before the guide rail frame 31 moves to the next exposure location.

For example, the moving speed of the exposure lamp at this time is in the range of 0.2 to 0.3 m/s, and the moving speed of the guide rail frame is in the range of 3.0 to 6.0 m/s.

For example, both the guide rail frame 31 and the N marking vehicles 32 are provided with infrared detectors (not illustrated in the figure), which are used to detect locations of the marking vehicles 32 and the guide rail frame 31 on the mask plate 2.

The infrared detectors can detect distances between a marking vehicle and the guide rail frame and between a marking vehicle and a marking vehicle by infrared detection, so as to detect locations of individual marking vehicles and the guide rail frame 31 on the mask plate. By doing this, the marking vehicles 3 and the guide rail frame 312 can move to corresponding locations on the mask plate 2 under the control of the controller 34.

For example, it is possible that the controller 34 receives location of the guide rail frame 31 on the mask plate 2 detected by the infrared detectors by a wireless transmission technology, and makes the guide rail frame 31 move to a corresponding exposure location on the mask plate 2 under its control. It is also possible that the controller 34 receives locations of the marking vehicles 32 on the mask plate detected by the infrared detectors by a wireless transmission technology, and sends control signals to the marking vehicles by the wireless transmission technology to control the marking vehicles to move to corresponding marking locations, so as to display corresponding marking identifications. As such, interference with the exposure process caused by controlling a marking vehicle through a data wire in prior art is avoided.

For example, as illustrated in FIG. 1, the exposure device further includes a linear motor 33, which is connected to the guide rail frame 31, and acts to drive the guide rail frame 31 to move linearly along a direction perpendicular to the guide rail frame 31 on the mask plate 2. At this time, the controller 34 may take control of movement of the guide rail frame through the linear motor 33.

For example, a marking vehicle 32 is a mask for forming an identification pattern. When a marking operation is conducted, an exposure for forming a marking identification is carried out by enabling light emitted by the exposure lamp 1 to be transmitted through the pattern of the marking vehicle 32. Thus, the marking vehicle may also be called as a marking mask. That is, the same light source can be used as a light source for marking and a light source for exposure of a circuit pattern, and exposure of the circuit pattern and exposure of an identification pattern can be completed synchronously.

For example, in the propagating direction of light emitted by the exposure lamp 1, the exposure lamp 1, the marking vehicle 32 and the mask plate 2 are arranged sequentially in this order.

For example, a portion of the mask plate 2 corresponding to a place in need of marking is pervious to light, and therefore, when a marking operation is conducted, light emitted from the exposure lamp 1 can be transmitted through pattern of the marking vehicle 32 and then transmitted through the mask plate 2, so that an identification pattern emerges through exposure.

For example, after exposure is accomplished, the process for forming marking may be the same as the process for forming the circuit pattern. For example, the identification pattern may be formed by development, etching and other process.

According to an embodiment of the invention, there is further provided an exposure method applied to the above exposure device, comprising the following steps.

101, an exposure lamp moves horizontally to perform an exposure on a mask plate.

102, a controller makes the guide rail frame move to a corresponding exposure location on the mask plate earlier than the exposure lamp under its control, and makes the marking vehicle lie in a corresponding marking location under its control, so as to display a corresponding marking identification.

The step 102 is carried out circularly with the controller while the step 101 is carried out, until exposure locations on the mask plate are all subjected to exposure. In such a way, after the step 101 is accomplished and a one-time exposure is conducted on the mask plate, exposure of a circuit pattern and exposure of an identification pattern are accomplished simultaneously. When it is compared to a multiple exposure in prior art, time of the exposure process is greatly saved, and production capacity is enhanced.

As illustrated in FIG. 2, the marking vehicle 32 includes a body module 321 and a display panel module 322 that are assembled together. The display panel module 322 includes an identification display zone 3221 and a transmissive buffer zone 3222 that is located between the body module 321 and the identification display zone 3221. The identification display zone 3221 is used for display of a corresponding marking identification as the marking vehicle 32 lies in a corresponding marking location; and the transmissive buffer zone 3222 is used for transmissive display. In this case, the step 102 includes the following steps concretely.

1021, after exposure of the identification display zone at a first exposure location on the mask plate with the exposure lamp is finished, the controller takes control of the identification display zone of the marking vehicle for a transmissive display, and meanwhile makes the guide rail frame start to move under its control, so that the guide rail frame moves to a second exposure location on the mask plate earlier than the exposure lamp.

Because marking locations on the mask plate 2 are fixed, when the other part of the mask plate 2 is exposed with the exposure lamp 1, the guide rail frame moves to an exposure location earlier, and the marking vehicle moves to a corresponding marking location, for displaying a corresponding marking identification. As illustrated in FIG. 3, at a T1 time, the exposure lamp 1 is going to move to the exposure location. At a T2 time, the exposure lamp 1 goes through an exposure at the identification display zone 3221 of the marking vehicle at a corresponding marking location; and at this time, the exposure lamp 1 is about to enter the transmissive buffer zone 3222 that acts to avoid light of the exposure lamp from being blocked by the body module 321. When light of the exposure lamp will move out of the identification display zone 3221 at the T2 time, the identification display zone 3221 turns into transmissive display, and at the same time, the guide rail frame 31 starts to move to the next marking location, and moving speed of the guide rail frame is greater than moving speed of the exposure lamp. FIG. 3 illustrates relative positions of the exposure lamp 1 and the marking vehicle 32 at a T3 time before the guide rail frame 31 moves to the next exposure location. For example, at this time, the moving speed of the exposure lamp is in the range of 0.2 to 0.3 m/s, and the moving speed of the guide rail frame is in the range of 3.0 to 6.0 m/s.

Both the guide rail frame and the marking vehicle are provided with infrared detectors, which are used to detect locations of the marking vehicle and the guide rail frame on the mask plate 2. Then, the controller making the marking vehicle lie in a corresponding marking location under its control so as to display a corresponding marking identification as stated in the step 102 and 103 includes that:

the controller receives location of the guide rail frame on the mask plate detected by the infrared detectors by a wireless transmission technology, and makes the guide rail frame move to a corresponding exposure location on the mask plate under its control. Next, the controller receives location of the marking vehicle on the mask plate detected by the infrared detectors by a wireless transmission technology, and sends a control signal to the marking vehicle by the wireless transmission technology to make the marking vehicle move to a corresponding marking location under its control, so as to display a corresponding marking identification. As such, interference with the exposure process caused by controlling a marking vehicle through a data wire in prior art is avoided.

For example, the exposure device further includes a linear motor 33, which is connected to the guide rail frame, and acts to drive the guide rail frame to move linearly along a direction perpendicular to the guide rail frame on the mask plate. Then, the controller taking control of movement of the guide rail frame includes that, the controller takes control of movement of the guide rail frame by controlling the linear motor.

Descriptions made above are merely exemplary embodiments of the invention, but are not used to limit the protection scope of the invention. The protection scope of the invention is determined by attached claims.

The invention claimed is:

1. An exposure device, comprising: an exposure lamp, a mask plate and a marking equipment, the marking equipment comprising:
a guide rail frame, disposed on the mask plate;
at least one marking vehicle, disposed on the guide rail frame;
a controller, configured to control the guide rail frame move to a corresponding exposure location on the mask plate earlier than the exposure lamp, and to control the marking vehicle lie in a corresponding marking location, for displaying a corresponding marking identification.

2. The device claimed as claim 1, wherein, the marking vehicle is a mask for forming an identification pattern.

3. The device claimed as claim 1, wherein, the marking vehicle includes a body module and a display panel module assembled together;
the display panel module includes: an identification display zone and a transmissive buffer zone that is located between the body module and the identification display zone;
the identification display zone acts to display the corresponding marking identification when the marking vehicle lies in the corresponding marking location;
the transmissive buffer zone acts to conduct a transmissive display.

4. The device claimed as claim 3, wherein, after exposure of a marking location at a first exposure location on the mask plate with the exposure lamp is finished, the controller acts to control the identification display zone of the marking vehicle to perform a transmissive display, and meanwhile to control the guide rail frame start to move, so that the guide rail frame moves to a second exposure location on the mask plate earlier than the exposure lamp.

5. The device claimed as claim 1, wherein, a moving speed of the exposure lamp upon the mask plate being exposed with it is in a range of 0.2 to 0.3 m/s, and a moving speed of the guide rail frame under the control of the controller is in a range of 3.0 to 6.0 m/s.

6. The device claimed as claim 1, wherein, both the guide rail frame and the marking vehicle are provided with infrared detectors, which are used to detect locations of the marking vehicle and the guide rail frame on the mask plate.

7. The device claimed as claim 6, wherein, the controller acts to receive location of the guide rail frame on the mask plate detected by the infrared detectors by a wireless transmission technology, to control the guide rail frame move to the corresponding exposure location on the mask plate, next, to receive location of the marking vehicle on the mask plate detected by the infrared detectors by the wireless transmission technology, and further to send a control signal to the marking vehicle by the wireless transmission technology to control the marking vehicle move to the corresponding marking location, so as to display the corresponding marking identification.

8. The device claimed as claim 7, wherein, the device further comprises a linear motor;
the linear motor is connected to the guide rail frame, and acts to drive the guide rail frame to move linearly along a direction perpendicular to the guide rail frame on the mask plate;
the controller acts to take control of movement of the guide rail frame by controlling the linear motor.

9. The device claimed as claim 1, wherein, the exposure machine is configured to conduct a row-by-row exposure on the mask plate, the direction in which the guide rail moves is perpendicular to a row direction, and the guide rail is configured to be able to control the marking vehicle move in the row direction.

10. The device claimed as claim 1, wherein, in a propagating direction of lights emitted by the exposure lamp, the exposure lamp, the marking vehicle and the mask plate are arranged sequentially in this order.

11. The device claimed as claim 1, wherein, a portion of the mask plate corresponding to a place in need of marking is pervious to light.

12. An exposure method with the exposure device claimed as claim 1, comprising the following steps:
moving the exposure lamp horizontally to conduct an exposure on the mask plate;
making the guide rail frame move to a corresponding exposure location on the mask plate earlier than the exposure lamp under the control of the controller, and making the marking vehicle lie in a corresponding marking location under the control of the controller, so as to display a corresponding marking identification.

13. The method claimed as claim 12, wherein, the marking vehicle includes a body module and a display panel module assembled together; the display panel module includes: an identification display zone and a transmissive buffer zone that is located between the body module and the identification display zone; wherein, the identification display zone acts to display the corresponding marking identification when the marking vehicle lies in the corresponding marking location; the transmissive buffer zone acts to conduct a transmissive display;
making the guide rail frame move to the corresponding exposure location on the mask plate earlier than the exposure lamp under the control of the controller and making the marking vehicle lie in the corresponding marking location under the control of the controller so as to display the corresponding marking identification includes:
after exposure of the identification display zone at a first exposure location on the mask plate with the exposure lamp is finished, making the identification display zone of the marking vehicle perform a transmissive display under the control of the controller, and meanwhile making the guide rail frame start to move under the control of the controller, so that the guide rail frame moves to a second exposure location on the mask plate earlier than the exposure lamp.

14. The method claimed as claim 13, wherein, a moving speed of the exposure lamp upon the mask plate being exposed with it is in a range of 0.2 to 0.3 m/s, and a moving speed of the guide rail frame under the control of the controller is in a range of 3.0 to 6.0 m/s.

15. The method claimed as claim 12, wherein, both the guide rail frame and the marking vehicle are provided with infrared detectors, which are used to detect locations of the marking vehicle and the guide rail frame on the mask plate; and making the marking vehicle lie in a corresponding marking location under the control of the controller so as to display the corresponding marking identification includes:
receiving location of the guide rail frame on the mask plate detected by the infrared detectors through a wireless transmission technology by the controller, making the guide rail frame move to the corresponding exposure location on the mask plate under the control of the controller, afterwards, receiving location of the marking vehicle on the mask plate detected by the infrared detectors through the wireless transmission technology by the controller, and then sending a control signal to the marking vehicle by the wireless transmission technology from the controller to make the marking vehicle lie in the corresponding marking location, so as to display a corresponding marking identification.

16. The method claimed as claim 12, wherein, the device further comprises a linear motor; the linear motor is connected to the guide rail frame, and acts to drive the guide rail frame to move linearly along a direction perpendicular to the guide rail frame on the mask plate; and the control over the movement of the guide rail frame with the controller includes:
taking control of movement of the guide rail frame by means of controlling the linear motor with the controller.

17. The device claimed as claim 2, wherein, the marking vehicle includes a body module and a display panel module assembled together;
the display panel module includes: an identification display zone and a transmissive buffer zone that is located between the body module and the identification display zone;
the identification display zone acts to display the corresponding marking identification when the marking vehicle lies in the corresponding marking location;
the transmissive buffer zone acts to conduct a transmissive display.

18. The device claimed as claim 2, wherein, a moving speed of the exposure lamp upon the mask plate being exposed with it is in a range of 0.2 to 0.3 m/s, and a moving speed of the guide rail frame under the control of the controller is in a range of 3.0 to 6.0 m/s.

19. The device claimed as claim 2, wherein, both the guide rail frame and the marking vehicle are provided with infrared detectors, which are used to detect locations of the marking vehicle and the guide rail frame on the mask plate.

20. The device claimed as claim 2, wherein, the exposure machine is configured to conduct a row-by-row exposure on the mask plate, the direction in which the guide rail moves is perpendicular to a row direction, and the guide rail is configured to be able to control the marking vehicle move in the row direction.

* * * * *